(12) United States Patent
German et al.

(10) Patent No.: US 8,174,287 B2
(45) Date of Patent: May 8, 2012

(54) PROCESSOR PROGRAMMABLE PLD DEVICE

(75) Inventors: Michael German, Modiin (IL); Michel Ivgi, Yehud (IL); Roee Elizov, Tel Aviv (IL); Shlomo Davidson, Tel Aviv (IL); Yair Khayat, Rosh Haayin (IL)

(73) Assignee: Avaya Inc., Basking Ridge, NJ (US)

( * ) Notice: Subject to any disclaimer, the term of this patent is extended or adjusted under 35 U.S.C. 154(b) by 47 days.

(21) Appl. No.: 12/565,133

(22) Filed: Sep. 23, 2009

(65) Prior Publication Data

US 2011/0068823 A1 Mar. 24, 2011

(51) Int. Cl.
*H03K 19/173* (2006.01)

(52) U.S. Cl. ............... 326/38; 326/41; 326/47; 714/725

(58) Field of Classification Search ............... 326/37–41, 326/46–47; 714/724–726
See application file for complete search history.

(56) References Cited

U.S. PATENT DOCUMENTS

| | | | |
|---|---|---|---|
| 5,426,738 A * | 6/1995 | Hsieh et al. ............ | 326/38 |
| 5,764,076 A | 6/1998 | Lee et al. | |
| 6,441,641 B1 * | 8/2002 | Pang et al. ............ | 326/41 |
| 6,459,297 B1 | 10/2002 | Smiley | |
| 6,948,147 B1 * | 9/2005 | New et al. ............ | 716/117 |
| 7,075,331 B2 * | 7/2006 | Pail et al. ............ | 326/38 |
| 7,248,070 B1 * | 7/2007 | Guilloteau et al. ............ | 326/38 |
| 7,265,578 B1 | 9/2007 | Tang et al. | |
| 2003/0023771 A1 * | 1/2003 | Erickson et al. ............ | 709/327 |
| 2006/0119384 A1 * | 6/2006 | Camarota et al. ............ | 326/38 |

* cited by examiner

*Primary Examiner* — Jason M Crawford
(74) *Attorney, Agent, or Firm* — Sheridan Ross P.C.

(57) ABSTRACT

A device including a PLD with at least one interface logic block connection for passing data between (i) a bus arranged for receiving data from an external processor and (ii) at least one I/O register connected with a JTAG interface of the PLD, wherein said interface logic block includes logic for translating data on the bus into a data format for the I/O register. A processor programmable PLD appliance comprising (a) a programmable PLD having a JTAG programming interface supporting real-time re-programming of the PLD while the PLD functions as programmed; and (b) an I/O register interfacing an I/O register and connected with the JTAG programming interface, wherein a PLD logic design implementation of the I/O register is externally accessible through an interface logic block of the PLD, and wherein the interface logic block includes a PLD path between (i) an external processor interface and (ii) the PLD-implemented I/O register.

13 Claims, 9 Drawing Sheets

PRIOR ART

PROCESSOR PROGRAMMABLE PLD DEVICE

TECHNICAL FIELD

The present specification generally relates to embodiments for field-programming of a programmable logic device (PLD) using a CPU interface. More specifically, the present specification relates to embodiments of PLDs that are preferably capable of accepting live reprogramming in-the-field using functional interfaces.

BACKGROUND ART

A programmable logic device (PLD) is an electronic component used to build reconfigurable digital circuits. Unlike a logic gate, which has a fixed function, a PLD has an undefined function at the time of manufacture. Before the PLD can be used in a circuit, it must be programmed (i.e. reconfigured). PLDs are typically, but certainly not exclusively, used in application simultaneously requiring a logic device and a memory device; such as in reconfigurable computing systems, distributed gateway architectures, and the like.

Normally PLDs are configured and/or reprogrammed in the field using allocated dedicated I/O pins and wires specifically for this task. Styles of reprogramming via allocated I/O pins are described in—U.S. Pat. No. 5,764,076: Circuit for partially reprogramming an operational programmable logic device; U.S. Pat. No. 7,265,578: In-system programming of non-JTAG device using SPI and JTAG interfaces; U.S. Pat. No. 6,459,297: System for programming field programmable devices; U.S. Pat. No. 7,248,070: Method and system for using boundary scan in a programmable logic device.

For the sake of good order, it is noted that a "JTAG" in our context is a "PLD JTAG programming interface". Joint Test Action Group (JTAG) is the usual name used for the IEEE 1149.1 standard entitled Standard Test Access Port and Boundary-Scan Architecture. The JTAG interface allows hardware to transfer data (signals) into internal non-volatile device memory; for programming as well as testing and debugging the device. A JTAG interface is a special (at least) four/five-pin interface connector on a chip or a board, wherein the connector pins are TDI (Test Data In), TDO (Test Data Out), TCK (Test Clock), TMS (Test Mode Select), and optional TRST (Test Reset—used by some devices to apply reset to the device). JTAG interfaces are typically used in PLDs, field-programmable gate arrays, complex programmable logic device, CPU's, controllers and the like.

Figure 1:
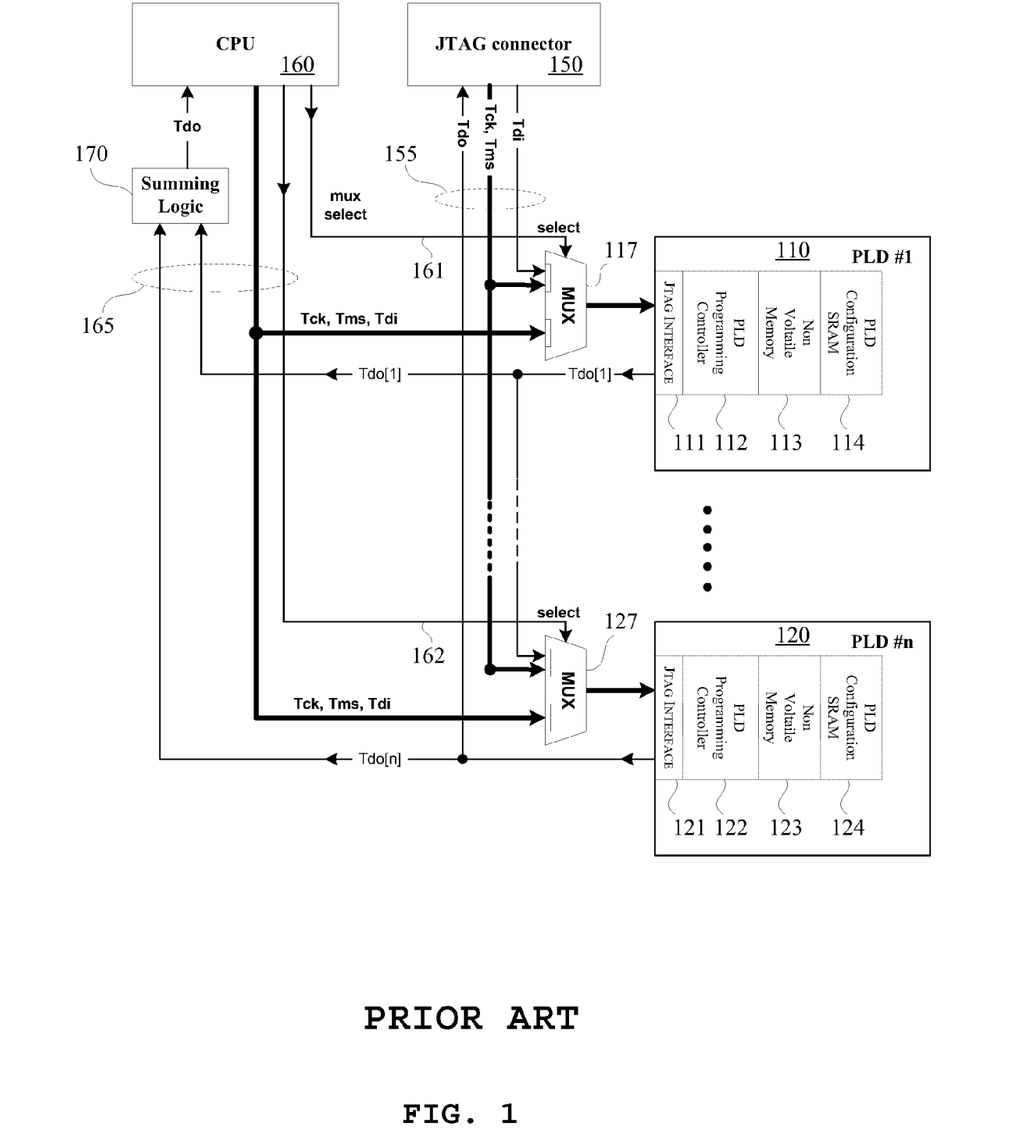
FIG. 1 illustrates a schematic view of a PLD field programming system according to typical prior art.

Recent developments in PLD's have made it possible to re-program a PLD using a JTAG interface, while the PLD is operating as previously programmed, without the re-programming process interrupting the PLD's normal operation. This can be better understood in conjunction with a careful study of FIG. 1, showing a scheme suitable for field programming a PLD (e.g. 110) or a multitude of PLDs (110, 120). In a PLD programming controller (112), instructions received serially through a JTAG interface block (111) are translated into specific PLD instructions; a Non-Volatile Memory (NVRAM) (113) is loaded with those instructions, forming the required new program; and on power-up or on a dedicated reset signal, the content of the NVRAM is transferred over to a SRAM (114)—wherein the SRAM (114) is responsible for the configuration of the PLD (110). It should be understood that the SRAM content is not affected during the process of loading the new program into the NVRAM (113), meaning that the re-programming process does not alter the normal operation of the PLD (110). It should further be understood that SRAM may be employed in various embodiments including SRAM block internal to the PLD, distributed memory cells, memory attached to the PLD logic cells and the like.

It should however be noted, that with prior art PLD's, employed in prior art architectures, addressing a multitude of PLDs serially, along a JTAG chain, manifests a great disadvantage. Such a serial architecture requires the completeness of the JTAG chain, hence it is severely sensitive to any instance of removing an element thereof or disenfranchising post-failure PLDs from the system. There is thus a longstanding need in the PLD arts for instantiation which will allow greater flexibility and robustness to adding or removing PLD's from the system, and in particular to such disenfranchising post-failure PLDs.

In the system described in FIG. 1, the PLDs (110, 120) can be programmed either by a JTAG programmer (not shown) connected to a JTAG connector (150), or by the CPU (160). In practice, the JTAG connector (150) may be used for serially programming or testing the PLDs (110, 120) present in the respective JTAG chain, while the CPU (160) may be used for programming the PLDs individually. In order to provide a solution which allows programming of any PLD (e.g. 110) in the distributed system, a multiplexer (MUX) (117, 127) is associated with each PLD. The MUX is designed to allow the CPU direct access to the JTAG (programming) interface of the target PLD upon a proper "select" signal. The PLD to be programmed is selected through the CPU field-programming interface, according to the unique MUX Select line (161, 162) which is being selected.

A set of dedicated programming wires (165) (duplications of the four typical JTAG wires) and control signals are driven by the CPU toward the distributed PLDs. The CPU uses the control signals to activate the multiplexer elements along the way and near the PLDs so that these dynamically route the data on the programming wires to the selected one-of-many target PLDs, requiring reprogramming. In the default case no select line (161, 162) is activated and all MUX elements direct towards the PLDs (110, 120) the programming wires and control signals (155) driven by the JTAG connector, thus enabling in the default case serial programming by the JTAG connector (150). It should be noted that in this solution for field programming PLDs, the complexity of the wiring increases with the number of PLDs to be programmed. This poses a severe penalty on systems including a multitude of PLDs, and moreover, serious difficulty in designing distributed systems which are scalable, namely including a changeable number of units and in particular a changeable number of PLDs.

Thus, there remains a need for JTAG-interfaced, field programmable PLDs, specifically in distributed systems comprising a multitude of such PLDs. Furthermore, there is a need for a solution that, while employing a JTAG interface for re-programming the PLDs, would circumvent the inherent serial nature of the architecture associated with the JTAG chain. Thus, PLDs field programming solution is needed, that allows accessing and programming any single PLD independently of other PLDs in the system, and irrespectively of previous or later accessing and programming such PLDs. Moreover, there is need for a solution that thus enables addressing and programming any single PLD as described above, in a distributed and scaleable system, without scarifying the complexity of the system and its wiring.

Alternately stated, in a system requiring firmware updates to PLDs, dedicated signals and wire resources presently have to be allocated. These signals carry the PLD firmware datasignal stream. In a system having multiple PLDs, and on the other hand, limited wire resources, there would be economic benefits to using PLDs with minimal additional wires.

Even though less allocated pins on the PLD itself might represent an aspect of progress, a PLD requiring more IOs (e.g. implementing a data transfer "shunt") but saving on overall system distributed wires (logic/complexity) would be of greater benefit.

SUMMARY OF EMBODIMENTS

The aforesaid longstanding needs are significantly addressed by embodiments, which specifically relate to a processor programmable PLD device. The device, associated appliances, systems, and methods embodiments, are especially useful in improving the economic viability of multiple PLD instantiations wherein there exists an ongoing need to minimize wiring complexity. The improved economic viability is especially apparent for modular systems including a chassis with multiple and/or detachable boards; each with at least one PLD.

The first embodiment is a processor programmable PLD device that comprises a PLD with at least one interface logic block connection connected for passing data between (i) a bus arranged for receiving data from an external processor and (ii) at least one I/O register connected with a JTAG interface of the PLD, wherein the interface logic block includes logic for translating data on the bus into a data format for the I/O register. Simply stated, providing the interface logic block for facilitating download of processor determined data via a bus to at least one I/O register connected with a JTAG interface of the PLD, circumvents the heretofore costly need for a distribution of dedicated buses and signals throughout the system I/O pin(s) thereto.

It should be understood that in conjunction with any of the described embodiments, the external processor's bus can be any bus (e.g. parallel or serial) arranged for maintaining communication and particularly for sending and receiving data between (i) a CPU or a central controller and (ii) memory or any other peripheral interface. The actual connection of the bus to the PLD and/or to the interface logic block, may incorporate the whole bus or just a portion (a sub-group of the bus' signals) thereof.

While one may perhaps argue about the cost and benefit of this implementation for a single PLD "system", it is without doubt advantageous to use an existing CPU bus to reach a plurality of PLDs in a single "system". Specifically, a system having a chain of PLDs pays a severe penalty when one of the PLDs in that chain is removed or dysfunctional (disenfranchising post-failure PLDs from the system); while using the bus to reach a plurality of PLDs remains robust during such typically occurring PLD outages.

The "at least one interface logic block" of the aforementioned device embodiment uses PLDs functionally almost as they are today used, however with significantly less external wiring, particularly when employed and integrated in large numbers. The device is directed to a broader class of evolving multiple PLD topologies.

In a second embodiment, a processor programmable PLD appliance comprises: (a) a programmable PLD having a JTAG programming interface supporting real-time re-programming of the PLD while the PLD remains capable of functioning as previously programmed; and (b) an I/O register interface interfacing an I/O register and connected with the JTAG programming interface, wherein a PLD logic design implementation of the I/O register is externally accessible through an interface logic block of the PLD, and wherein the interface logic block includes a PLD design implementation data-path between (i) an external processor interface and (ii) the PLD-implemented I/O register. Briefly, there exists an interface connection between the I/O register and the JTAG interface. Such an interface connection can consist for example of a control command from the I/O register to the I/O register interface, controlling the connection between the I/O register interface and the JTAG interface.

The appliance embodiment specify a narrow class of instantly modified PLDs wherein the PLD I/O register interface is externally accessible because of an interface logic block providing data-path between (i) an external processor (e.g. CPU) interface and (ii) an internal PLD-implemented I/O register. This embodiment precludes those aforementioned disenfranchising post-failure PLDs from the system—since for prior art PLDs, one is either bound to addressing the PLDs serially due to the serial architecture of the JTAG chain; or is bound to increase the wiring complexity of the system as the number of PLD's in the system increases.

In a third embodiment, a processor programmable PLD system comprises (a) a processor; and (b) at least one PLD with respectively at least one interface logic block connection between (i) a bus transferring data from the processor and (ii) at least one I/O register connected with a JTAG interface of a PLD, wherein the interface logic block includes logic for translating data on the bus into a data format for the I/O register. This is the basic building block interconnection linkage facilitating new classes of multi-PLD topologies wherein the number of supplemental dedicated IO pin(s) has been restricted to numbers less than the scaling increase of the multi-PLD; especially in that some new instant multi-PLD architectures will be implemented without need for supplemental dedicated IO pin(s) whatsoever. More generally stated, the interface of the at least one I/O register is to any real or virtual connection; be it BUS, Internet, or the like.

JTAG supports chaining and indeed using this scheme when a few PLDs reside on a single module/unit, a process programmable PLD system is a "distributed" scalable platform. It provides modularity where a base unit may be optionally connected to a few expansion units (expanding the solution). Different blades/cards may be optionally placed in the Base or Expansion units.

This means that we do not duplicate the penalty prone classical PLD systems architecture. Using one single long chain to connect all the PLDs (on the Base, Expansion and blades) means that if one of the blades or Expansion units is removed (or not used) the whole chain is broken and we lose connectivity, etc. The advantage of CPU bus, in the context of the processor programmable PLD system embodiment, is that it reaches all units without introducing the penalty of breaking the chain when one of the elements is removed. In some cases breaking the chain also adds software penalty and complexity requiring the programming CPU to be able to recompile the JTAG stream in order to bypass nonexistent JTAG elements. The various embodiments allow for the achievement of scalable robust multi-PLD systems architectures; and when considering large numbers of such embodiment instantiations, one anticipates new facile methods for the management of such systems that contain now easily-accessible large-pluralities of distributed PLDs—as may become better appreciated from subsequent examples.

In a variation of the system embodiment described above, there are a multitude of PLDs, and the interface logic block connection between a bus transferring data from the processor and an I/O register connected with a JTAG interface of a PLD, can be implemented externally to the PLDs. This has the advantage of employing PLDs in various configurations in such distributed multi-PLDs systems, including the economic benefit of using off-the-shelf PLD's albeit having higher availability at lower cost.

In a fourth embodiment, a processor programmable PLD method comprises (a) arranging a PLD processor interface logic block configured to be connected to a processor's bus arranged for maintaining communication between (i) a CPU or a central controller and (ii) at least one peripheral interface; (b) arranging at least one programming I/O register connected to said interface logic block and further connectable and operable with a JTAG interface of a PLD; (c) passing data from said processor's bus to said interface logic block; and (d) translating at least part of said data from a data format of said processor's bus to a data format compatible with said at least one programming I/O register. In keeping with the needs of this art to anticipate integration and evolution of multi-PLD systems, numerous changes are anticipated to occur in the actual programming implementations of the instant PLDs—thereby creating a new discipline for the ongoing real time management of PLD updates; paralleling the strategies for managing multiprocessor CPUs. However, simply stated, a processor programmable PLD method embodiment has a bus transferring data from the processor to at least one I/O register connected with a JTAG interface of a PLD.

Accordingly, with regard to real world enablement of the embodiment, it is sufficient to note that methodologically a bus is transferring data from the processor to at least one I/O register connected with a JTAG interface of a PLD; including (a) passing data from a processor's bus to a PLD processor interface logic block, and (b) translating at least part of the data from a data format of said processor's bus to a data format compatible with at least one programming I/O register connected with a JTAG interface of the PLD. The processor can be an external CPU or a CPU on the motherboard or a circuit board, or any of many other CPU compliant systems topologies.

Please note, the present embodiments are herein described with a certain degree of particularity, however those versed in the art will readily appreciate that various modifications and alterations may be carried out without departing from either the spirit or scope, as hereinafter claimed.

BRIEF DESCRIPTION OF THE DRAWINGS

In order to understand the present embodiments and to see how it may be carried out in practice, embodiments will now be described, by way of non-limiting example only, with reference to the accompanying drawings. Furthermore, a more complete understanding of these present embodiments and the advantages thereof may be acquired by referring to the following description in consideration of the accompanying drawings, wherein.

DETAILED DESCRIPTION OF THE EMBODIMENTS

Figure 2A:
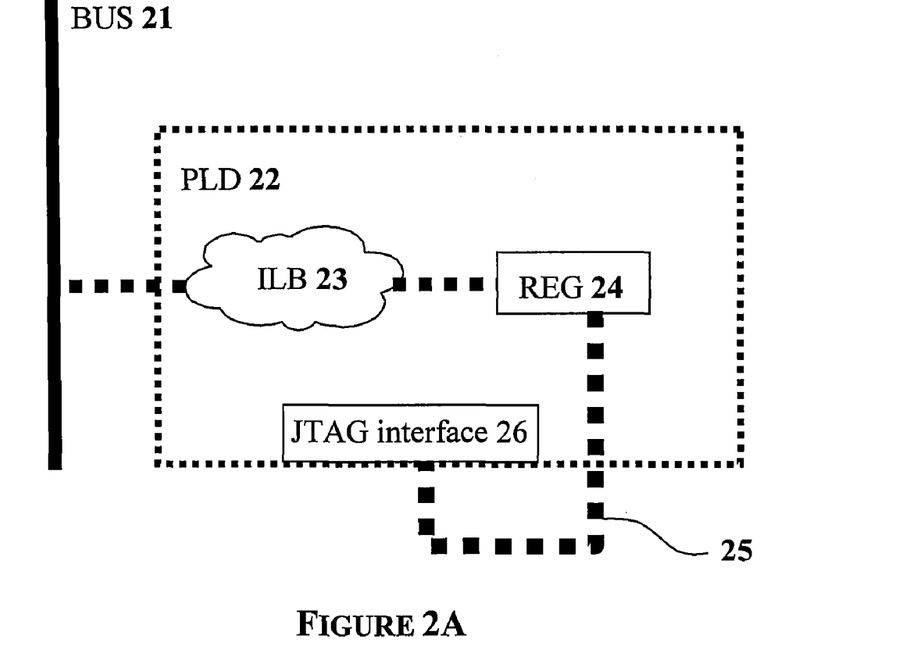
FIGS. 2A and 2B illustrate two schematic views of typical enabling modes of a processor programmable PLD device.
Figure 2B:
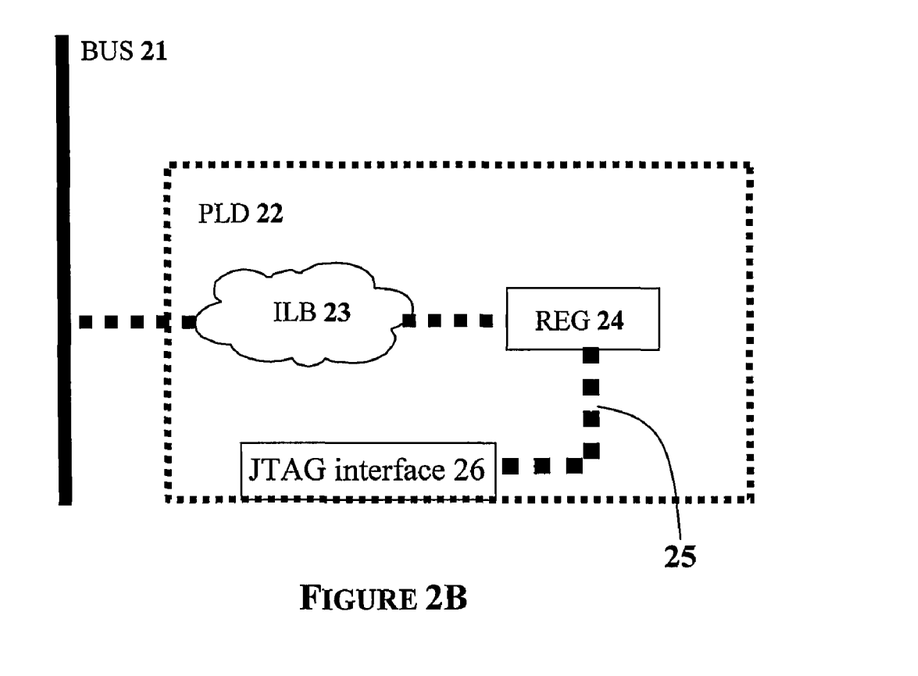

Now, turning to FIG. 2A and FIG. 2B (general device embodiments), a processor programmable PLD device embodiment comprises a PLD (22) with at least one interface logic block (23) connection connected for passing data between (i) a bus (21) arranged for sending and receiving data from an external processor and (ii) at least one I/O register (24) connected to a JTAG interface (26) of the PLD. The interface logic block (23) includes logic for translating data, enabling the interface logic block (23) to translate data streaming on the bus (21) into data formats used in conjunction, and are compatible with the JTAG interface (26) and vice versa. Thus, the interface logic block includes logic for translating data on the bus (21) into a data format for the I/O register (24) connected with the JTAG interface (26). Moreover, the interface logic block (23) can typically have logic to decode its specific address, and thus to recognize data addressed to the specific interface logic block (23) out of the various data present on the bus (21). In other words, depending on the protocol and interface type of the processor's bus (21), the interface logic block (23) can incorporate the necessary logic to locate, decode and identify data transactions on the CPU interface bus (21) targeted at the specific interface logic block (23), based on the specific addressing information attached or embedded or encoded in those data transactions.

It should be understood that the interface logic block (23) and/or the I/O register (24) can be implemented in the PLD by assigning for this task some of the programmable logic cells of the PLD itself. In other words, the interface logic block (23), including the logic for translating data formats as described above, can be programmed, e.g. by the user. Such an implementation of the interface logic block and/or the I/O register by programmable logic cells, can allow the user to update the logic incorporated in the interface logic block, thus facilitating updating the PLD to enable matching possible changes of various characteristics (e.g. data format) of the external processor and the interface bus (21).

According to a first variation embodiment of the instant device, shown in FIG. 2A, a connection of the at least one connection includes an external shunt (25) between (i) a predetermined pin of an I/O register connected to the interface logic block (23) and (ii) a predetermined pin of the JTAG interface (26). The specific I/O register to JTAG pin determinations (the at least one connection) are particular to the PLD pin assignments and to the nature of the communications (e.g. serial communications interface, parallel communications interface, packet communications interface, multiplexed communications interface, or the like).

According to a second variation embodiment of the instant device shown in FIG. 2B, a connection (25) of the at least one connection between (i) a predetermined pin of an I/O register connected to the interface logic block (23) and (ii) a predetermined pin of the JTAG interface (26) is internal to the PLD. In some instances of the embodiment this internal connection is implemented as an internal connection between a programmable logic cell of the PLD and the JTAG interface (26) of the PLD. This application of an internal shunt (e.g. on the silicon) anticipates a change to today's off-the-shelf PLDs in view of utilizing the benefits of the external shunt embodiment albeit without the macroscopic wiring and pin sacrifice, and cost and complexity associated therewith. Simply stated, this saves PLD pins—which are an important resource.

According to a third variation embodiment of the instant device of FIG. 2A or FIG. 2B, in the context of today's generic specification PLD nomenclature, the at least one I/O register connected with a JTAG of the PLD is an I/O register having a pin selected from the list: Tin, Tout, TCK, TMS, TD, TDI, TDO, and the like. Furthermore, variations of programming the processor programmable PLD device include all or only part of the required signals via the at least one I/O register. For example, the PLD I/O register drives only the TDI JTAG signal while all other signals are routed/broadcasted to the JTAG interfaces of all PLDs on a separate set of wires. According to another option, the programming interface (e.g. all 4 signals) can be distributed generically to all PLDs (i.e. to a buffer near each PLD), and uses the CPU interface in the same manner; but this time in order to open/close the buffer assigned to each target (i.e. using an external I/O register interface, but targets it through the PLD that is being programmed)—as will be described in FIG. 8.

According to a fourth variation embodiment of the instant device of FIG. 2A or 2B, the JTAG is a front-end to a Non-Volatile memory of the PLD. This specific embodiment is mentioned because it is of instant practical use with PLDs of the kinds that one finds today. Furthermore, additions to NVRAMS and/or substitutes for them may become features of a next generation of PLDs, in light of the scalability improvements brought to PLD systems using these embodiments.

Figure 3:
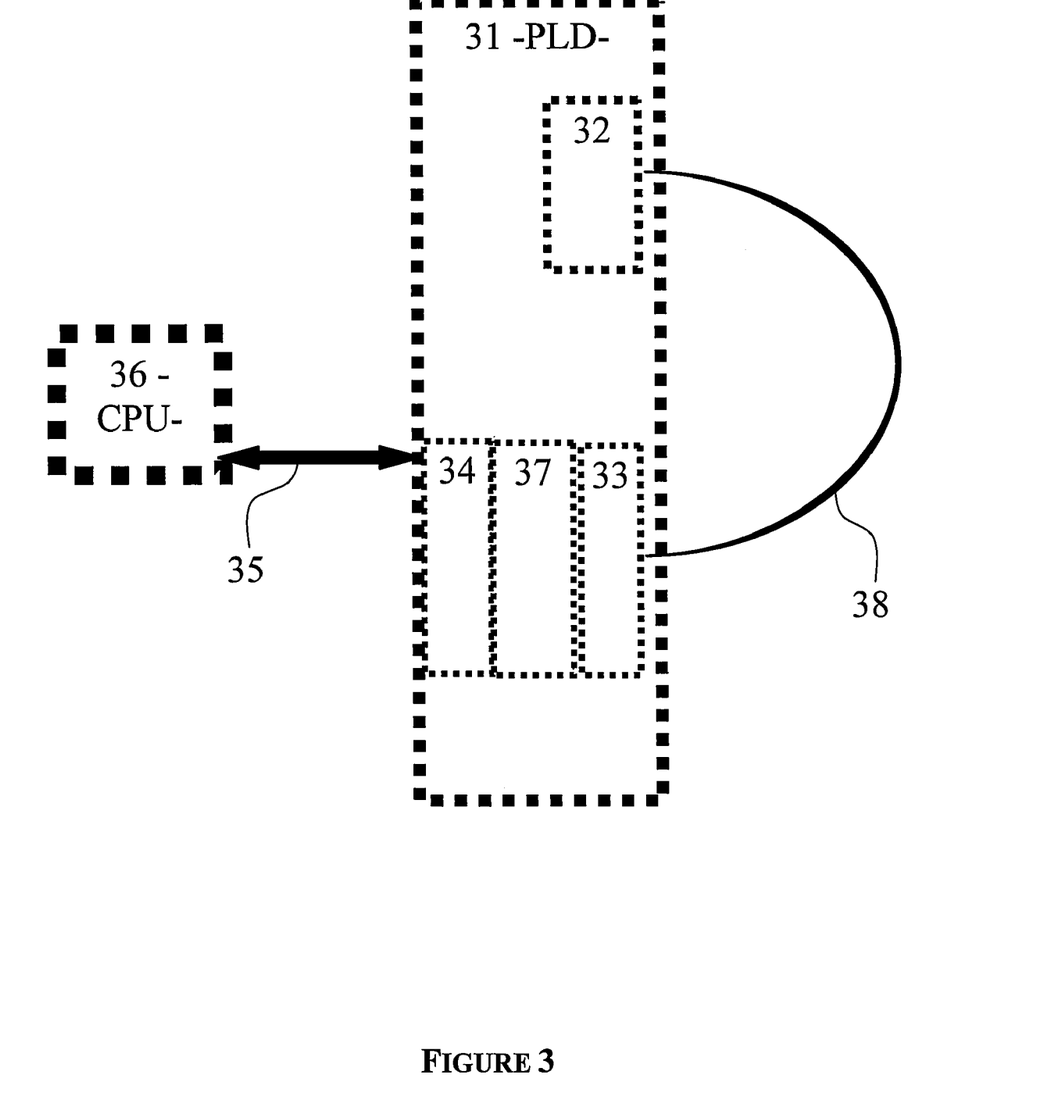
FIG. 3 illustrates a schematic view of a typical enabling mode of a single PLD, a processor programmable PLD appliance, and a simple architecture of multi-PLDs.

Turning to FIG. 3, a processor programmable PLD appliance embodiment comprises: (a) a programmable PLD (31) having a JTAG programming interface (32) supporting real-time re-programming of the PLD while the PLD remains capable of functioning as previously programmed; and (b) an I/O register interface (33) interfacing an I/O register (37) and connected with the JTAG programming interface (32), wherein a PLD logic design implementation of the I/O register (37) is externally accessible through an interface logic block (34) of the PLD, and wherein the interface logic block includes a PLD design implementation data-path (35) between (i) an external processor interface (36) and (ii) the PLD-implemented I/O register (37).

According to a second variation embodiment of the instant appliance, the JTAG programming interface includes at least three inputs (typically: TCK, TMS, TDI) and at least one output (typically: TDO) thus supporting a connection to a programming controller (not shown). The prudent man of the art will recall here that the PLD "real-time In-Circuit programming" mandatory feature/requirement is supported by Altera Max-II, Lattice MachXO and Xilinx CoolRunner-II PLDs, under various names. Accordingly, accommodation of the second variation embodiment is inherently supported by basic PLD specification.

Figure 4:
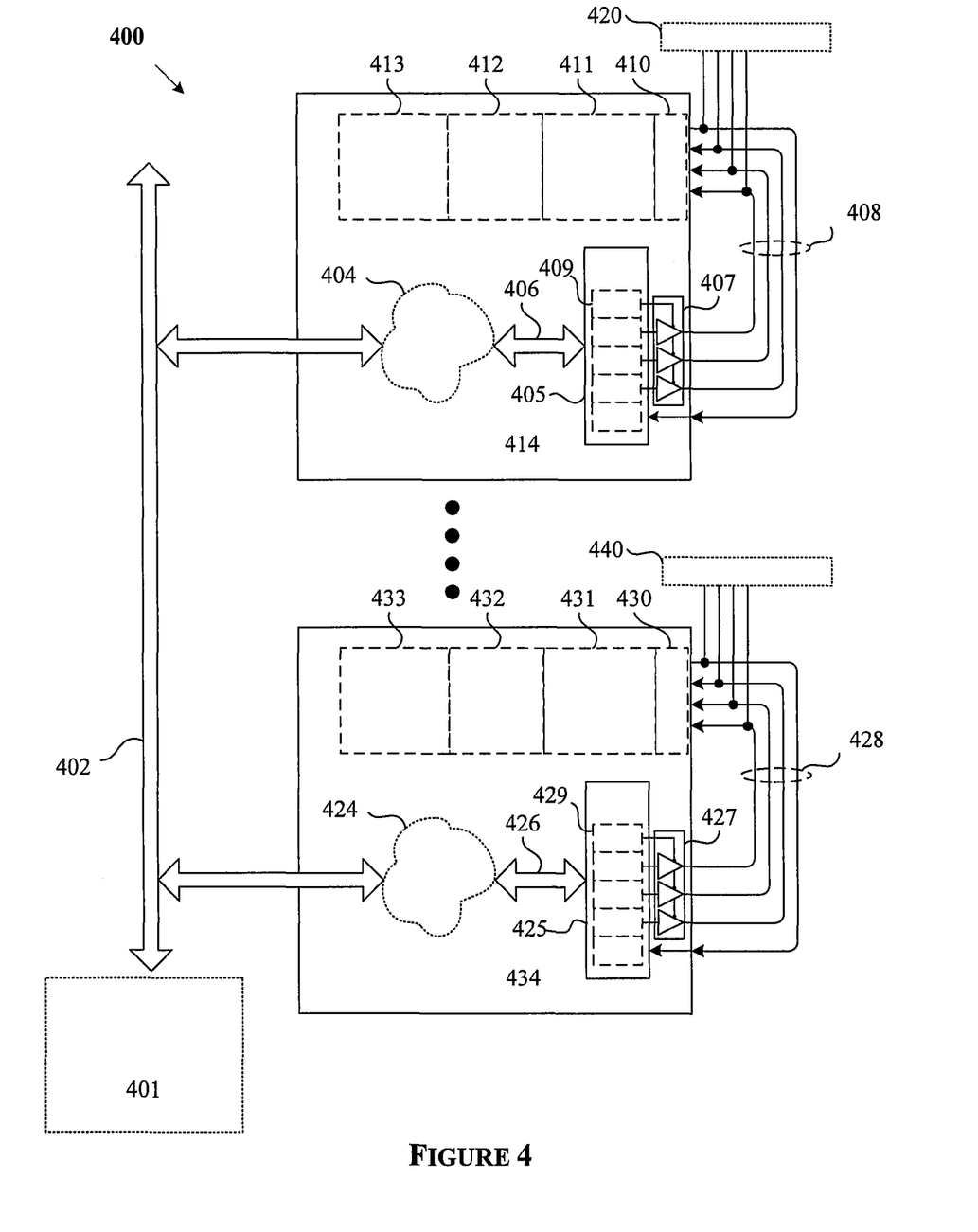
FIG. 4 illustrates an exemplary detailed schematic view of another typical enabling mode of a processor programmable PLD appliance, and a simple architecture of multi-PLD appliances.

FIG. 4, to which reference is now made, shows an example of a specific implementation of an embodiment of an appliance, consisting of a processor programmable PLD appliance, including a multitude of programmable PLD's (414 through 434). In this example, a processor unit 401, which can be a Central Processing Unit (CPU), a programmable controller or the like, is configured and arranged for accessing and programming the multitude of PLDs (414 through 434), through a CPU bus (402). It should be understood that in the scope of the instant embodiment, the CPU can access and program any specific PLD of the multitude of PLDs (414 through 434) or any group thereof. Moreover, any such programming process of a specific PLD from the multitude of PLDs (414 through 434) by the CPU, is independent from and unrelated to any previous or later programming process of any another PLD.

In the following detailed explanation of FIG. 4, the CPU-assisted real time programming of PLD (414), and the elements thereof, is provided. It should be understood that this explanation is equivalent, in the scope of FIG. 4, to any of the multitude of PLDs (414 through 434), respectively.

An interface logic block (404), a JTAG signal register (405), an internal bus (406) and a driver (407) in the PLD (414) are implemented in the PLD design and configured for translating CPU commands into signals suitable for programming the PLD through the JTAG interface of the PLD. The CPU interface logic block (404) detects CPU signals (e.g. read and write accesses) on the CPU bus (402) addressed to the JTAG signal register (405). These signals (e.g. read or write accesses) destined to the specific register (405) are conveyed to the register (405) through the internal bus (406). Data read by the CPU from the register (405) may be for example the value of the TDO signal driven by the JTAG interface block (410) of the PLD, on a JTAG interface bus (408). Data written to the register (405) by the CPU (401) may be for example the value of the TDI, TMS and TCK signals of the JTAG interface bus (408). Additional bit written to the register (405) by the CPU may be for example enable bit (409). According to this specific implementation the CPU sets the enable bit before sending programming/configuration stream to the JTAG interface bus (408). The enable bit activates a driver (407) of the three signals TDI, TMS, TCK so that the values of the respective bits in the register (405) are sent on the JTAG interface bus (408) toward the JTAG interface block (410) of the PLD. Further, according to the example, the enable bit is not set in the default case. As a result the signal driver (407) is disabled in the default case, allowing an external JTAG programmer to be connected to a JTAG connector (420) and drive the JTAG interface bus (408) as an alternative programming channel to the CPU-driven programming described above. This alternative programming, assisted by a JTAG programmer and the JTAG connector (420), may for example take place on the production line.

In this example the PLD implementation design includes elements which allow, inter alia real-time programming of the PLD, by an external device, through a JTAG interface of the PLD: the JTAG interface block (410), a PLD Programming Controller (411), a Non-Volatile memory (412) and a PLD Configuration SRAM (413). The JTAG interface block (410) is connected to the JTAG interface bus (408), which includes in this example at least 4 JTAG signals: TCK, TMS, TDI which serve as input to the PLD programming controller (411), and TDO which is driven by the PLD programming controller (411) as an output. The PLD programming controller (411) decodes the JTAG information arriving on signals TCK, TMS, TDI and conveys programming data toward the Non-Volatile Memory (412), where these data are recorded. During Power-on or following a JTAG reconfiguration command, the content of the NVRAM (412), is written into the SRAM memory (413), where it is translated and used to configure the user specific PLD's logic architecture/formation.

Figure 5:
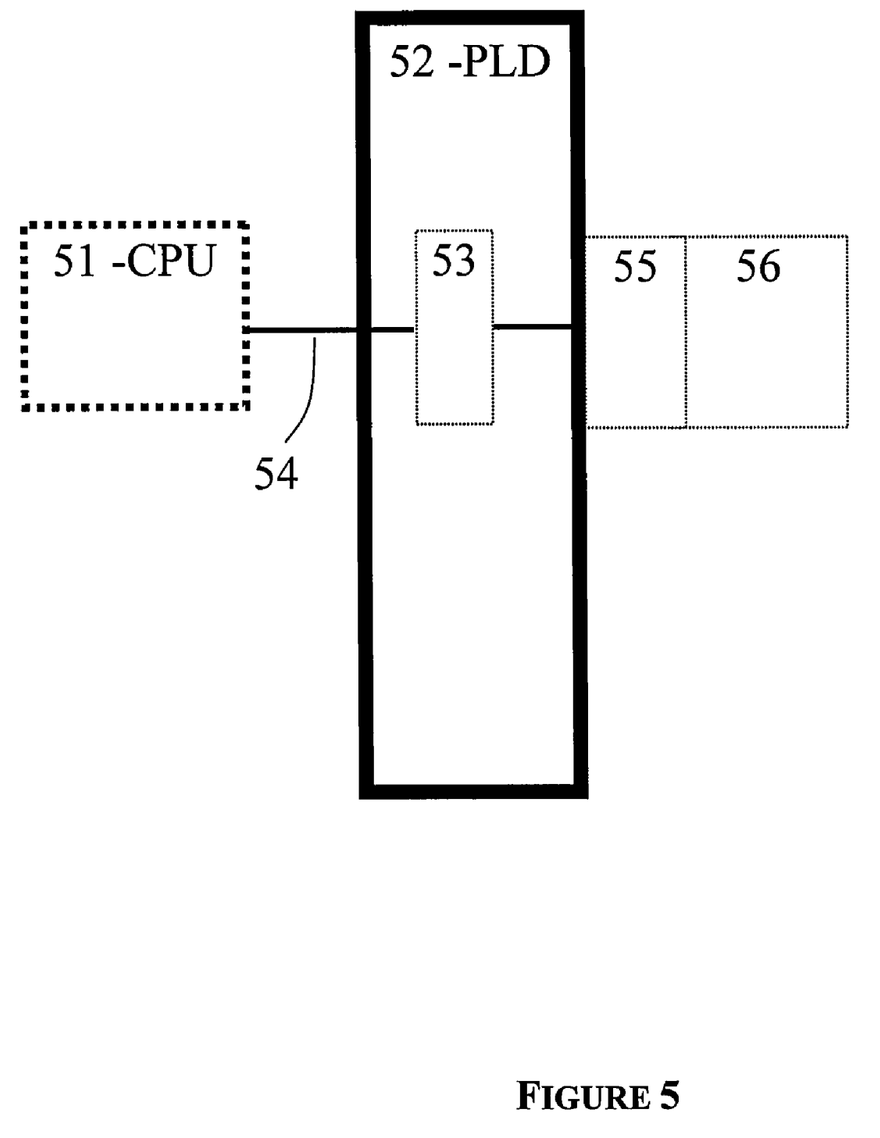
FIG. 5 illustrates a general schematic view of a typical enabling mode of a topologically more complex multiple PLD topology, a processor programmable PLD system.

Turning to FIG. 5 a processor programmable PLD system embodiment comprises (a) a processor (51); and (b) at least one PLD (52) with respectively at least one interface logic block (53) connection between (i) a bus (54) transferring data from the processor and (ii) at least one I/O register (55) connected with a JTAG interface (56) of a PLD, wherein the interface logic block (53) includes logic for translating data on the bus (54) into a data format for the I/O register (55).

Figure 6:
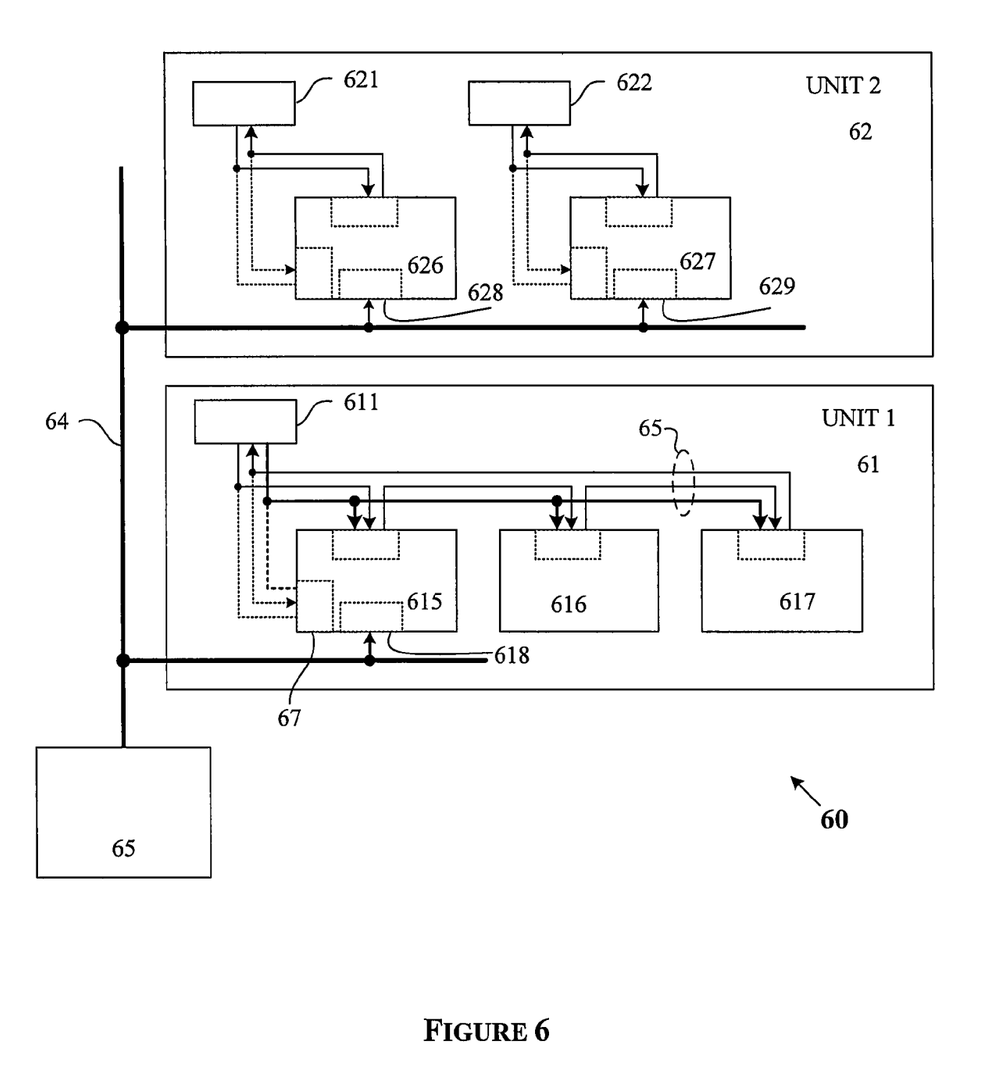
FIG. 6 illustrates a more detailed schematic view of another typical enabling mode of a topologically more complex multiple PLD mixed topology, a processor programmable PLD system.

Systems so configured lend themselves to various multi-PLD and optionally mixed topologies, of which two examples will be given in conjunction with FIG. 6. A distributed system as shown in FIG. 6, is a view of a typical modular system (60) including for example several units. As seen, each unit in the system has its own at least one (production-line) JTAG connector (611, 621, 622). In addition, each unit supports field programming by the main CPU through the CPU bus (64). The diagram of FIG. 6 provides examples of two types of implementation using the suggested programming solution. These examples demonstrate the scalability and flexibility of the instant solution. (Note: Units 1 & 2 are separately detachable.)

Specifically, here each of the two units hosts a few PLDs. In Unit 1 (61) only one PLD (615), of multiple PLDs (615, 616 and 617), provides a CPU interface logic block (618) to the CPU bus (64). In this case only this PLD implements the additional logic, namely the interface logic block (618) and a programming I/O register (67) required for self-programming. The other PLDs, PLD A2 (616) and PLD A3 (617), in Unit 1 (61) are connected to this PLD (615) in a JTAG chain (65) and can be programmed as well through that chain, said programming can originate in a JTAG controller (not shown) connected to the JTAG connector (611), or in the CPU (65).

Unit 2 (62) is hosting two PLDs, PLD B1 (621) and PLD B2 (622), controlled by the CPU (65). In Unit 2 (62) each PLD, PLD B1 (621) and PLD B2 (622), is provided with a dedicated CPU interface logic block (628, 629 respectively for each PLD) therefore allowing the CPU to have direct and independent programming access.

It should be understood that other implementations are possible, with various combinations of units, including a multitude of PLD thereon, depending on the specific architecture and requirements. Thus, various topologies are suggested using the instant embodiments. In some instances, PLDs are connected one to another as described above. In the next example, one part of a PLD is connected to another part of the same PLD. Therefore, returning to FIG. 5, according to a first variation embodiment of the instant system, the PLD (52) with at least one interface logic block connection (53) is the same PLD as the PLD of the at least one I/O register connected with a JTAG interface (56); thereby providing a simple class of systems topology linkages. As mentioned earlier "PLDs are typically, but certainly not exclusively, used in application simultaneously requiring a logic device and a memory device; such as in reconfigurable computing systems, distributed gateway architectures, and the like." Thus the convolution of multiple PLD systems architectures suggests various configurations topologies; and this current first variation embodiment is perhaps the simplest member of this systems architecture "family".

According to a second variation embodiment of the instant system, the bus (54) is selected from the list: serial communications interface, parallel communications interface, packet communications interface, multiplexed communications interface, and a combination of any of the aforesaid; thereby providing various protocol options within many of the classes of systems topology linkages. This variation takes on greater importance when considering paradigm shifting protocols implementing the task of managing updates and/or otherwise reprogramming large distributed asynchronous poly-autonomous systems having a very large plurality of PLDs.

According to a third variation embodiment of the instant system, the processor is selected from the list: a Central Processing Unit, a controller, a general programming logic device, a programming logic element, and another PLD; thereby providing a computationally more complex class of systems topology linkages.

Figure 7:
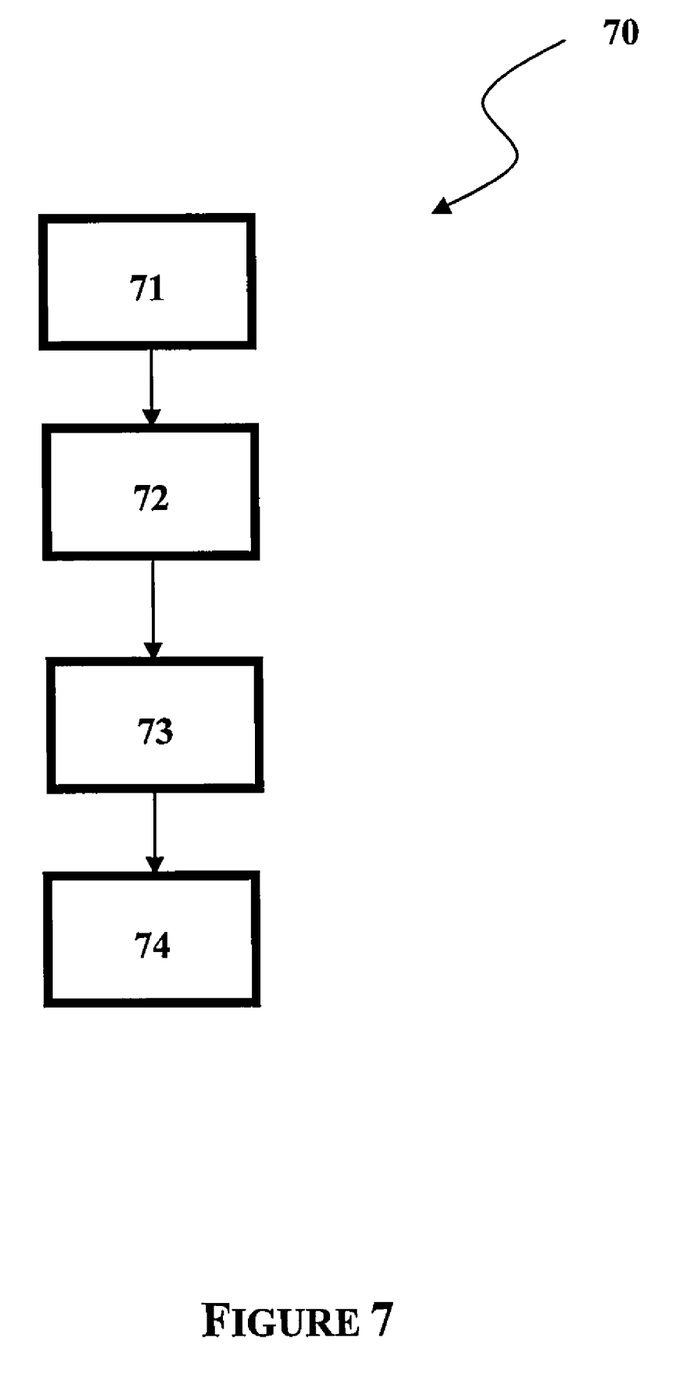
FIG. 7 illustrates a schematic view of a processor programmable PLD method.

Turning to FIG. 7, a processor programmable PLD method embodiment (70) comprises (a) arranging (71) a PLD processor interface logic block configured to be connected to a processor's bus arranged for maintaining communication between (i) a CPU or a central controller and (ii) at least one peripheral interface; (b) arranging (72) at least one programming I/O register connected to said interface logic block and further connectable and operable with a JTAG interface of a PLD; (c) passing data (73) from said processor's bus to said interface logic block; and (d) translating (74) at least part of said data from a data format of said processor's bus to a data format compatible with said at least one programming I/O register. The method may optionally include also passing some data in the opposite direction, namely passing data from a programming I/O register to a PLD processor interface logic block, and forwarding at least part of the data from the PLD processor interface logic block to a processor's bus.

Figure 8:
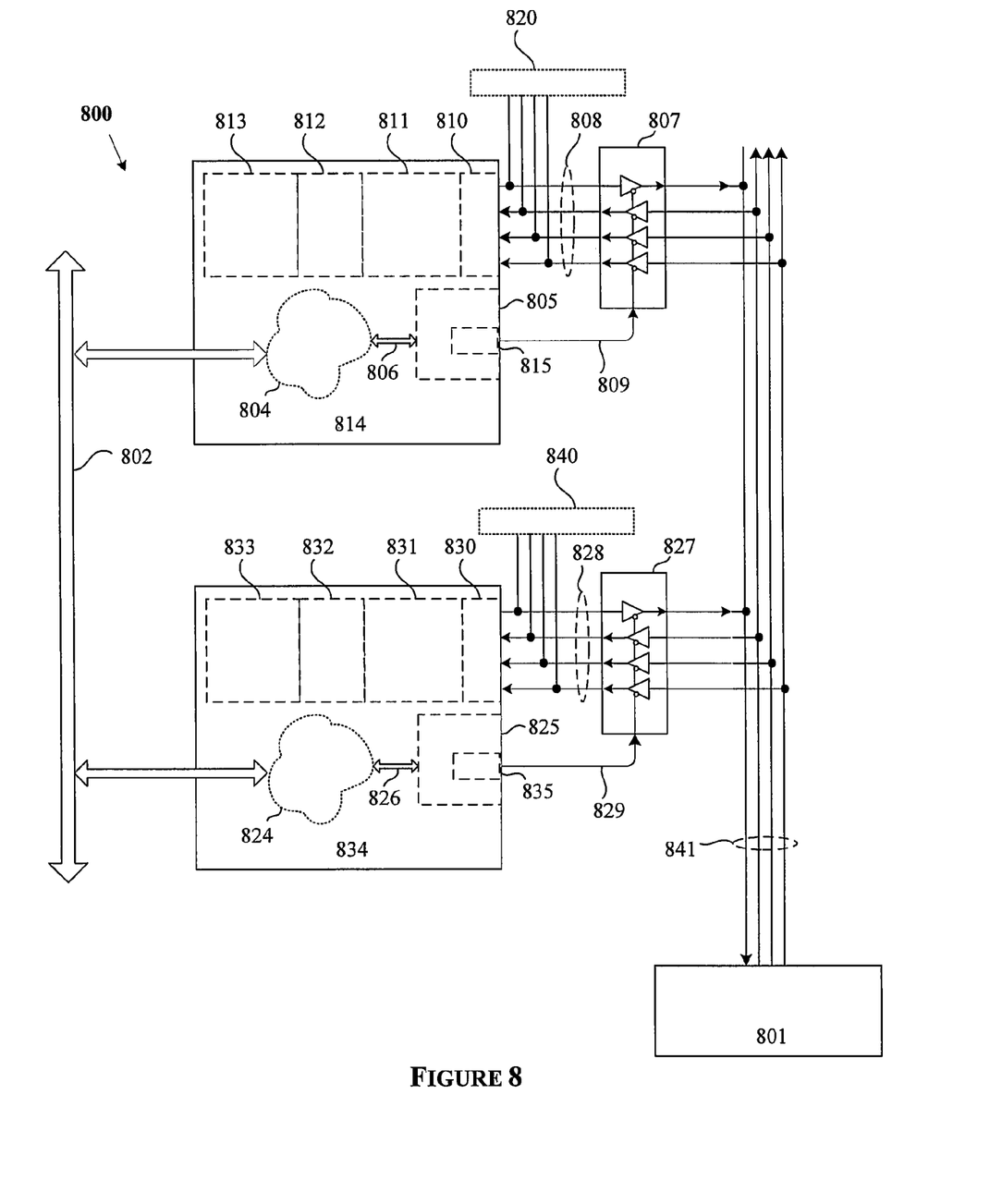
FIG. 8 illustrates architecture of a specific processor programmable multi-PLD appliance architecture implementation.

FIG. 8, to which reference is now made, is a schematic of another implementation consisting of one or more PLDs (814, 834) and using buffers (807, 827) implemented as I/O register interfaces. In this case the buffer-enable is the only control signal data transferred through the existing CPU interface (802) to the PLDs (814, 834). The PLDs (814, 834) are assumed to allow for real-time programming while remaining capable of functioning as previously programmed, having respectively JTAG interface blocks (810, 830), PLD programming controllers (811, 831), Non-Volatile memories (812, 832) and PLD Configuration SRAMs (813, 833).

Looking at PLD#1 (814) here, a CPU interface logic (804) receives data/signal from a CPU interface (802) and passes it to an I/O register (805) having an enable-register (815). The I/O register is thus being externally accessible to and from the CPU through the CPU interface logic (804) and via a data path implementation (806). Data written to the register (805) is typically the value of an enable signal controlling the external JTAG Buffer (807). The JTAG buffer (807) is connected between a JTAG/PLD programming bus (808)—the bus being arranged for passing JTAG signals therethrough to the JTAG interface block (810)—and a JTAG/PLD programming Bus (841). A JTAG connector (820) can optionally be also connected to the JTAG/PLD programming bus (808) as is described further below. An enable bit (809) is written/being set before sending programming/configuration stream to the JTAG interface bus (808) of the selected PLD (814). The enable bit (809) activates the buffer (807) thereby connecting the PLD programming bus (841) and a host/controller (801) to the one selected PLD JTAG interface. Thus, only one PLD can be programmed at any given time. In this example, a CPU or controller (801) generates the PLD configuration stream and the data is sent on the programming bus (841) to the dedicated JTAG programming bus (808). Thus, according to this embodiment, the PLDs can be programmed using the JTAG programming bus (841) but without the constraint of chaining, conventionally attributed to such JTAG programming architecture. The buffers (807, 827) are controlled centrally from the CPU bus (802) via the PLDs (814, 834), thus providing the system with scalability and modularity.

At default, the enable bit (809) is not set. As a result the JTAG buffer (807) is disabled, allowing an external JTAG programmer to be connected to a JTAG connector (820) and to drive therethrough the JTAG interface bus (808). This may typically take place on the production line.

Figure 9:
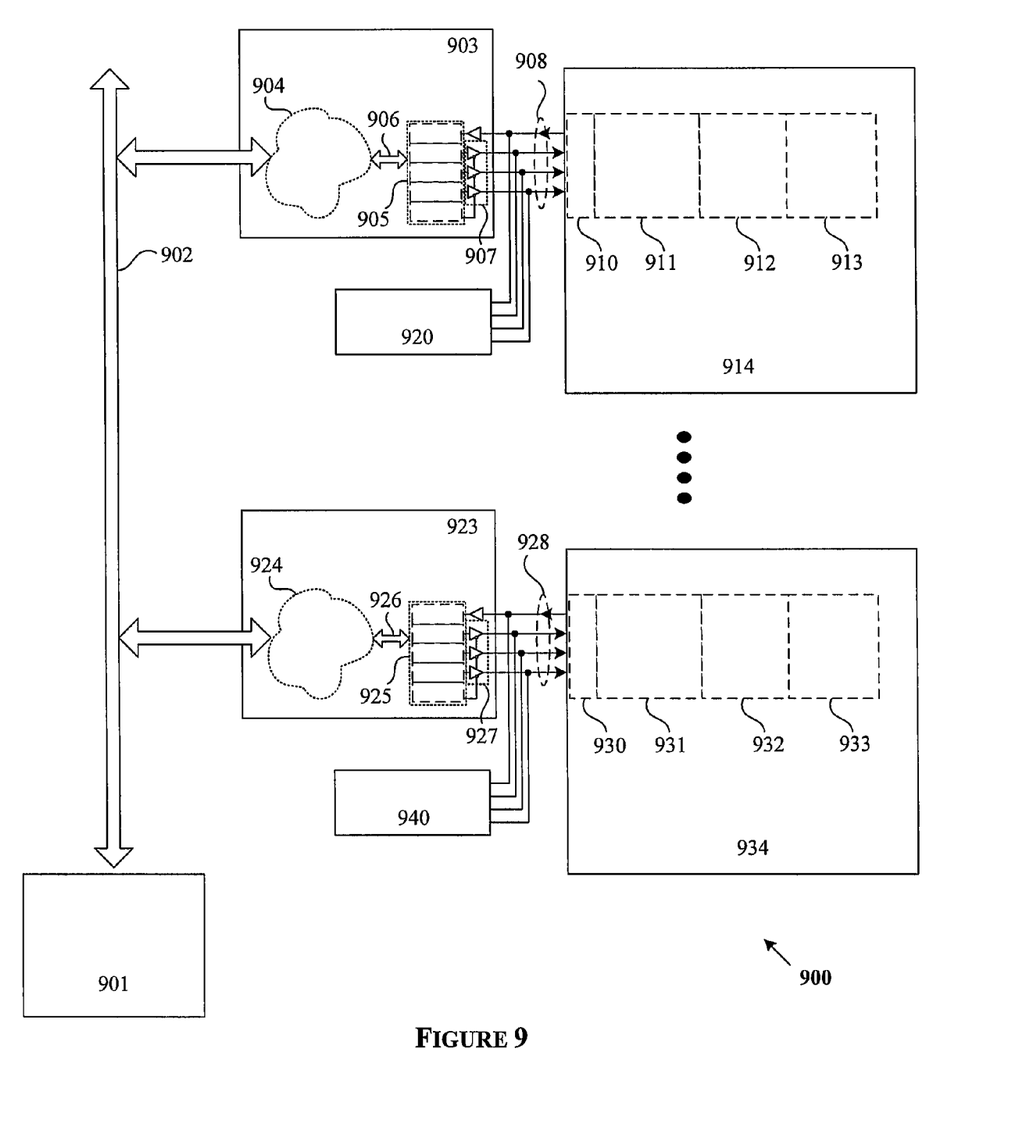
FIG. 9 illustrates architecture of another specific processor programmable multi-PLD appliance architecture implementation.

Lastly, FIG. 9, is a schematic of yet another embodiment of a PLD appliance—consisting of one or more PLDs (914, 934) and external bridges (903, 923), used as translation elements. In this system the bridges are used to translate CPU-originated data from a CPU bus (902), to programming instructions of the PLDs (914, 934). The PLDs in this system are assumed to allow for field programming, and optionally allow also for real-time programming as is previously described, having a JTAG interface block (910, 930), PLD programming controller (911, 931), Non-Volatile memory (912, 932), and PLD Configuration SRAM (913, 933).

In this example, a CPU (901) generates the PLD configuration data, which is sent on the CPU bus (902). Looking at PLD#1 (914) and its related elements in the system, the translations elements/bridge (903) connects to the CPU bus (902). Implemented in the bridge (903), a CPU interface logic block (904) detects CPU read and write accesses on the CPU bus (902) intended/addressed to a JTAG signal registers (905). Read or write accesses destined to the specific register (905) are conveyed to the register through the interface logic block connection (904) and an internal bus (906). Data read by the CPU from the register (905) may typically be the value of the TDO signal driven by a JTAG interface block (910) of the PLD, on a JTAG interface bus (908). Data written to the register (905) may typically be the value of the TDI, TMS and TCK signals of the JTAG interface bus (908). An additional bit written to the register (905) may be an enable bit. The CPU writes/sets the enable bit before sending programming/configuration stream to the JTAG interface bus (908). The enable bit activates a driver (907) of the three signals (TDI,TMS, TCK) so that the value of the respective bits in the register (905) are sent on the JTAG interface bus (908) toward the JTAG interface block (910) of the PLD. At default, the enable bit is not set. As a result the signal drivers (907) are disabled allowing an external JTAG programmer to be connected to a JTAG connector (920) and drive the JTAG interface bus (908). This default procedure may for example take place on the production line.

Looking to future PLD generations, according to a variation embodiment of the instant method, forwarding at least part of the data includes transforming said at least part using at least one Boolean operator; thereby effectively facilitating broad classes of smart implementations—particularly when convolved with the aforementioned systems topology linkages, and/or with the aforementioned protocols. For example, when an external program update management systems "remembers" the programming instruction kernel of a PLD, then the kernel can be rapidly upgraded in the PLD by XOR-ing a new program kernel fragment set (patches); which is much more efficient than to rewrite the old kernel with an entire new kernel.

While the processor programmable PLD devices, appliances, systems, and associated methods are herein described with respect to specific examples including presently preferred modes of carrying out embodiments, those skilled in the art will appreciate that there are numerous variations and permutations of the processor programmable PLD described devices, appliances, systems, methods and relates techniques and protocols that fall within the spirit and scope of the embodiments as set forth in the appended claims.

We claim:

1. A processor programmable PLD device comprising:
   a Non-Volatile memory;
   a JTAG interface in communication with the Non-Volatile memory and connected to an external JTAG bus;
   at least one I/O register connected with the JTAG interface; and
   a interface logic block connection connected to a bus arranged for receiving data from an external processor and the at least one I/O register connected with the JTAG interface, wherein said interface logic block connection includes logic for translating data on the bus into a data format for the I/O register.

2. The device according to claim 1, wherein a connection of the at least one I/O register connection includes an external shunt between (i) a predetermined pin of the at least one I/O register connected to the interface logic block and (ii) a predetermined pin of the JTAG interface.

3. The device according to claim 1, wherein a connection of the at least one I/O register connection is internal between (i) a predetermined pin of the at least one I/O register connected to the interface logic block and (ii) a predetermined pin of the JTAG interface.

4. The device according to claim 1, wherein the at least one I/O register connected with the JTAG interface of the PLD is an I/O register having a pin selected from the list: Tin, Tout, TCK, TMS, TD, TDI, TRST, and TDO.

5. The device according to claim 1, wherein the JTAG interface is a front-end to a Non-Volatile memory of the PLD.

6. A processor programmable PLD appliance comprising:
   a PLD, the PLD comprising:
      a Non-Volatile memory;
      a JTAG programming interface in communication with the Non-Volatile memory and connected to an external JTAG bus, the JTAG programming interface supporting real-time re-programming of the PLD while the PLD remains capable of functioning as previously programmed;
      an interface logic block in communication with a bus that communicates with an external computer;
      an I/O register in communication with the interface logic block, wherein the I/O register is externally accessible through the interface logic block; and
      an I/O register interface in communication with interfacing the I/O register and the JTAG programming interface, wherein the I/O register interface communicates data from the I/O register to the JTAG programming interface.

7. The appliance according to claim 6, wherein the JTAG programming interface includes at least three inputs to a PLD programming controller and at least one output from the PLD programming controller.

8. A processor programmable PLD system comprising:
   a processor;
   a JTAG bus;
   a bus in communication with the processor; and
   a PLD in communication with the JTAG bus, the PLD comprising:
      a JTAG interface connected to the JTAG bus;
      an I/O register connected with the JTAG interface of the PLD, wherein the I/O register provides data to the JTAG interface; and
      an interface logic block in communication with the JTAG bus transferring data from the processor, wherein the interface logic block includes logic for translating data on the bus into a data format for the I/O register.

9. The system according to claim 8, wherein the said PLD with at least one interface logic block connection is the same PLD as the PLD of the at least one I/O register connected with a JTAG interface.

10. The system according to claim 8, wherein the JTAG bus is selected from the list: serial communications interface, parallel communications interface, packet communications interface, multiplexed communications interface, virtual interface, and a combination of any of the aforesaid.

11. The system according to claim 8, wherein the processor is selected from the list: a Central Processing Unit, a controller, and a general programming logic device, a programming logic element.

12. A system according to claim 8, wherein the PLD is a multitude of PLDs, and wherein said interface logic block connection is respectively implemented externally to any of said multitude PLDs.

13. A processor programmable PLD method comprising:
arranging a PLD processor interface logic block configured to be connected to a processor's bus arranged for maintaining communication between:
a CPU or a central controller; and
at least one peripheral interface;
arranging at least one programming I/O register connected to said interface logic block and further connectable and operable with a JTAG interface of a PLD;
passing data from said processor's bus to said interface logic block; and
translating at least part of said data from a data format of said processor's bus to a data format compatible with said at least one programming I/O register.

* * * * *